(12) United States Patent
Nishimura

(10) Patent No.: US 12,315,771 B2
(45) Date of Patent: May 27, 2025

(54) SEMICONDUCTOR MODULE

(71) Applicant: FUJI ELECTRIC CO., LTD., Kanagawa (JP)

(72) Inventor: Tomohiro Nishimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 484 days.

(21) Appl. No.: 17/409,807

(22) Filed: Aug. 24, 2021

(65) Prior Publication Data
US 2022/0115284 A1   Apr. 14, 2022

(30) Foreign Application Priority Data

Oct. 13, 2020 (JP) ................... 2020-172787

(51) Int. Cl.
*H01L 23/29* (2006.01)
*H01L 23/14* (2006.01)
(Continued)

(52) U.S. Cl.
CPC ............ *H01L 23/295* (2013.01); *H01L 23/14* (2013.01); *H01L 23/16* (2013.01); *H01L 23/31* (2013.01);
(Continued)

(58) Field of Classification Search
CPC ......... H01L 2924/15; H01L 2224/8338; H01L 2224/83385; H01L 2224/83395;
(Continued)

(56) References Cited

U.S. PATENT DOCUMENTS

| | | | |
|---|---|---|---|
| 2010/0187675 A1* | 7/2010 | Shimizu | H01L 21/563 257/E23.116 |
| 2012/0119372 A1* | 5/2012 | Yasukawa | H01L 23/36 438/126 |

(Continued)

FOREIGN PATENT DOCUMENTS

| | | |
|---|---|---|
| JP | 2014116409 A | 6/2014 |
| JP | 2014146774 A | 8/2014 |

(Continued)

OTHER PUBLICATIONS

Haiying Wang, Yilong Bai, Sheng Liu, Jiali Wu, C.P. Wong, Combined effects of silica filler and its interface in epoxy resin, Acta Materialia, vol. 50, Issue 17, 2002, pp. 4369-4377, ISSN 1359-6454, hereinafter Wang (Year: 2002).*

(Continued)

*Primary Examiner* — Evren Seven
*Assistant Examiner* — Cole Leon Lindsey

(57) ABSTRACT

A semiconductor module is provided, comprising a circuit board having a predetermined circuit pattern, a semiconductor chip placed on the circuit board, a wiring member configured to connect the semiconductor chip and the circuit pattern, and a sealing resin configured to seal the semiconductor chip and the wiring member, wherein the sealing resin has a first resin including an inorganic filler and an epoxy resin, which covers the semiconductor chip and a second resin having a smaller elastic modulus than the first resin, which is provided on a surface of the first resin, and wherein the second resin is separated from the semiconductor chip and the circuit board.

22 Claims, 9 Drawing Sheets

(51) Int. Cl.
*H01L 23/16* (2006.01)
*H01L 23/31* (2006.01)
*H01L 23/495* (2006.01)
*H05K 1/18* (2006.01)

(52) U.S. Cl.
CPC ....... *H01L 23/49575* (2013.01); *H05K 1/185* (2013.01)

(58) Field of Classification Search
CPC ..... H01L 23/28; H01L 23/31; H01L 23/3107; H01L 23/3157; H01L 23/49503; H01L 23/49506; H01L 23/4951; H01L 23/49513; H01L 2924/151; H01L 2924/161; H01L 2924/171; H01L 2924/181; H01L 2224/27013
See application file for complete search history.

(56) References Cited

U.S. PATENT DOCUMENTS

2017/0278771 A1* 9/2017 Kanai ................ H01L 23/3121
2018/0033711 A1  2/2018 Hartung
2018/0122927 A1* 5/2018 Sekino ............. H01L 23/49811

FOREIGN PATENT DOCUMENTS

| JP | 2014150203 A |   | 8/2014 |
| JP | 2015130457 A |   | 7/2015 |
| JP | 2015198227 A |   | 11/2015 |
| JP | 2017028159 A | * | 2/2017 |
| JP | 2017135310 A |   | 8/2017 |

OTHER PUBLICATIONS

Haiying Wang, Yilong Bai, Sheng Liu, Jiali Wu, C.P. Wong, Combined effects of silica filler and its interface in epoxy resin, Acta Materialia, vol. 50, Issue 17, 2002, pp. 4369-4377, ISSN 1359-6454 (Year: 2002).*

Trostyanskaya, E.B., Poimanov, A.M., Nosov, E.F. et al. Effect of fillers on the structure and properties of cured resins. Polymer Mechanics 5, 905-909 (1969). https://doi.org/10.1007/BF00864670 (Year: 1969).*

Office Action issued for counterpart Japanese Application No. 2020-172787, transmitted from the Japanese Patent Office on Jul. 2, 2024 (drafted on Jun. 27, 2024).

* cited by examiner

SEMICONDUCTOR MODULE

The contents of the following Japanese patent application are incorporated herein by reference:
NO. 2020-172787 filed in JP on Oct. 13, 2020.

BACKGROUND

1. Technical Field

The present invention relates to a semiconductor module.

2. Related Art

Conventionally, a semiconductor module with a semiconductor chip installed on a circuit board, and having the semiconductor chip and a circuit pattern of the circuit board connected through a wiring member is known. For such a semiconductor module, a sealing resin is used in order to protect the semiconductor chip (see patent document 1, for example).

[Patent document 1] Japanese Patent Application Publication No. 2017-28159

SUMMARY

Technical Problem

The reliability of the semiconductor module is preferably improved.

Technical Solution

In order to solve the above-described issue, a semiconductor module is provided in one aspect of the present invention. The semiconductor module may include a circuit board having a predetermined circuit pattern. The semiconductor module may include a semiconductor chip placed on the circuit board. The semiconductor module may include a wiring member configured to connect the semiconductor chip and the circuit pattern. The semiconductor module may include a sealing resin configured to seal the semiconductor chip and the wiring member. The sealing resin may have a first resin including an inorganic filler and an epoxy resin, which covers the semiconductor chip. The sealing resin may have a second resin provided on a surface of the first resin, which has a smaller elastic modulus than the first resin. The second resin may be separated from the semiconductor chip and the circuit board.

The summary clause does not necessarily describe all necessary features of the embodiments of the present invention. The present invention may also be a sub-combination of the features described above.

DESCRIPTION OF EXEMPLARY EMBODIMENTS

Hereinafter, the invention will be described through embodiments of the invention, but the following embodiments do not limit the invention according to claims. Moreover, not all combinations of features described in the embodiments are necessary to solutions of the invention. Note that, in the present specification and the drawings, duplicated explanation is omitted by providing identical references for elements having substantially identical functions or configurations, and illustration of elements that is not directly relevant to the present invention is omitted. In addition, an element having an identical function or configuration with other elements in one drawing is representatively provided with a reference, and references for the other elements may be omitted.

In the present specification, one side in a direction parallel to the depth direction of a semiconductor chip is referred to as an "upper" side, and the other side is referred to as a "lower" side. One surface of two principal surfaces of a substrate, a layer, or another member is referred to as an upper surface, and the other surface is referred to as a lower surface. The "upper" and "lower" directions are not limited to the gravitational directions or directions when the semiconductor module is implemented.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that, a +Z axis direction and a −Z axis direction are directions opposite to each other. When the Z axis direction is described without describing the signs, it means that the direction is parallel to the +Z axis and the −Z axis. In the present specification, the orthogonal axes parallel to the upper surface and the lower surface of the semiconductor chip is referred to as the X axis and the Y axis. In addition, an axis perpendicular to the upper surface and the lower surface of the semiconductor substrate is referred to as the Z axis. In the present specification, the direction of the Z axis may be referred to as the depth direction. In addition, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

Figure 1:
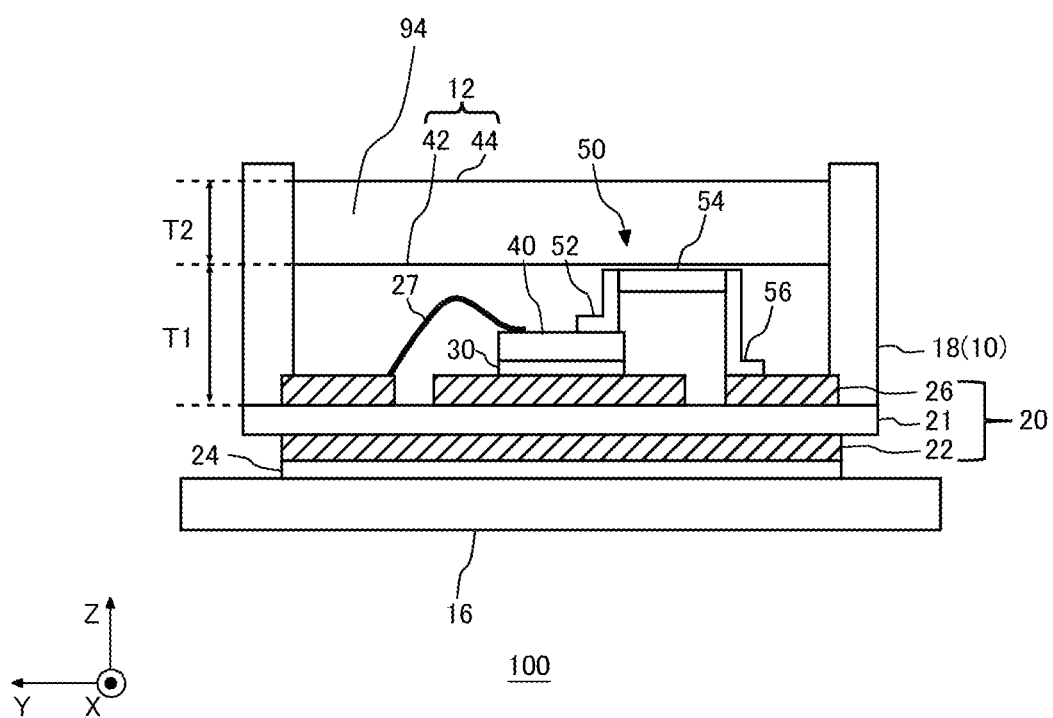
FIG. 1 illustrates an example of a semiconductor module 100 according to one embodiment of the present invention.

FIG. 1 illustrates an example of a semiconductor module 100 according to one embodiment of the present invention. The semiconductor module 100 may function as a power conversion device such as an invertor. The semiconductor module 100 includes one or more circuit boards 20. In the present specification, the orthogonal axes in a plane on which one or more circuit boards 20 are provided are referred to as the X axis and the Y axis, and the axis perpendicular to the X-Y plane is referred to as the Z axis. In FIG. 1, an exemplary arrangement of each member in the Y-Z plane is illustrated. The circuit board 20 has a predetermined circuit pattern 26 provided on either one of the surfaces of an insulating substrate 21, and a heat releasing board 22 on the other surface. The circuit pattern 26 and the heat releasing board 22 may be configured by bonding a copper plate or an aluminum plate, or alternatively a plate obtained by subjecting these materials to plating to an insulating substrate 21 formed of silicon nitride ceramics and aluminum nitride ceramics or the like, via direct bonding or via a brazing material layer. Note that, the circuit board 20 may be formed by laminating an insulating sheet onto a conductive member of the copper plate, the aluminum plate and the like. That is, the circuit board 20 may be a plate-shaped member having the conductive member integrated with the insulating member.

One or more semiconductor chips 40 are placed on the circuit board 20. In the example of FIG. 1, one semiconductor chip 40 is placed. A bonding layer 30 bonds the semiconductor chip 40 to the circuit pattern 26 of the circuit board 20. The bonding layer 30 is solder or the like. The semiconductor chip 40 or the like is protected by a resin package including a resin casing 10 surrounding the circuit pattern 26 of the circuit board 20 and a sealing resin 12 with which the resin casing 10 is filled. Note that, the semiconductor chip 40 or the like may be protected by a transfer mold or the like using the sealing resin 12, without providing the resin casing 10.

The semiconductor chip 40 may include an insulated gate bipolar transistor (IGBT), a diode such as a free-wheel diode (FWD), and a reverse conducting (RC)-IGBT obtained by combining the above, a MOS transistor and the like. The amount of heat generation of the semiconductor chip 40 changes according to the operating state. For example, in the RC-IGBT, the amount of heat generation changes since the energized site is different between a state in which the IGBT is turned on and a state in which the IGBT is turned off and a current flows through the FWD. Thus, in the semiconductor chip 40, temperature rise and temperature fall occurs while switching is performed.

The semiconductor chip 40 of the present example is a vertical chip on which electrodes (for example, an emitter electrode and a collector electrode) are formed on the upper surface and the lower surface. The semiconductor chip 40 is connected to the circuit pattern 26 of the circuit board 20 through the electrode formed on the lower surface, and connected to a wiring member through the electrode formed on the upper surface. Note that, the semiconductor chip 40 is not limited to a vertical chip. The semiconductor chip 40 may have an electrode connected to the circuit pattern 26 on the upper surface.

The resin casing 10 is provided such that it surrounds a space 94 housing the semiconductor chip 40. In FIG. 1, the resin casing 10 has a side wall 18. The side wall 18 surrounds the space 94 in the X-Y plane. The insulating substrate 21 is provided below the side wall 18. Note that, the space 94 may be a region above the insulating substrate 21 and a region surrounding the resin casing 10.

In the present example, the resin casing 10 is molded with a resin such as a thermosetting resin which can be formed by injection molding or a ultraviolet curing resin which can be formed by UV molding. Such resins may include one or more polymeric materials selected from polyphenylene sulfide (PPS) resin, polybutylene terephthalate (PBT) resin, polyamide (PA) resin, acrylonitrile-butadiene-styrene (ABS) resin, acrylic resin and the like, for example.

A heat releasing board 22 may cover at least a part of or the entire lower surface of the insulating substrate 21. The cooler 16 is directly or indirectly connected to the circuit board 20. In the present example, the cooler 16 may cover at least a part of or the entire lower surface of the heat releasing board 22. The bonding layer 24 bonds the heat releasing board 22 to the cooler 16. The bonding layer 24 is solder or the like. The cooler 16 has a coolant such as water included therein. The cooler 16 cools the semiconductor chip 40 via a heat releasing board 22 or the like.

The semiconductor chip 40 has its upper surface connected to the wiring member via a bonding layer (not shown) having solder or the like. The wiring members of the present example are a lead frame 50 and a wire 27. The lead frame 50 is a member formed of a metal material such as copper or aluminum. At least a part of the surface of the lead frame 50 may be plated with nickel or the like. In addition, at least a part of the surface of the lead frame 50 may be coated with resin or the like. The lead frame 50 may have a plate-shaped portion. Plate-shaped refers to a shape whose area of the two principal surfaces arranged opposite to each other is larger than the area of the other surfaces. At least the portion connected to the semiconductor chip 40 of the lead frame 50 may be plate-shaped. The lead frame 50 may be formed by folding one sheet of metal plate.

The lead frame 50 connects the semiconductor chip 40 and the circuit pattern 26. A main current may flow through the lead frame 50. Here, the main current is a maximum current of the current which flows through the semiconductor chip 40. The lead frame 50 of the present example has a chip connection portion 52, a bridging portion 54, and a circuit pattern connection portion 56. The chip connection portion 52 is a portion where the lead frame 50 is bonded to the upper surface of the semiconductor chip 40. The circuit pattern connection portion 56 is a portion where the lead frame 50 is connected to the upper surface of the circuit pattern 26. The chip connection portion 52 and the circuit pattern connection portion 56 may be plate-shaped portions approximately parallel to the X-Y plane. Note that, being approximately parallel refers to a state where the angle is 10 degrees or less, for example.

The bridging portion 54 connects the chip connection portion 52 and the circuit pattern connection portion 56. The bridging portion 54 is arranged away from the conductive member such as the circuit pattern 26. The bridging portion 54 of the present example is arranged above the circuit pattern 26 or the like, and is provided over the circuit pattern 26 or the like from the chip connection portion 52 to the circuit pattern connection portion 56.

The wire 27 connects the semiconductor chip 40 and the circuit pattern 26. A voltage for controlling the gate of the semiconductor chip 40 may be applied to the wire 27.

In the present example, the sealing resin 12 is provided inside the resin casing 10. The sealing resin 12 seals the semiconductor chip 40, and the lead frame 50 and the wire 27 which serve as the wiring member. That is, the sealing resin 12 covers the semiconductor chip 40 and the wiring member entirely such that the semiconductor chip 40 and the wiring member are not exposed. The semiconductor chip 40 and the wiring member can be protected by the sealing resin 12. Note that, an external terminal connected to the wiring member may be exposed from the sealing resin 12.

The sealing resin 12 in the present example has a first resin 42 and a second resin 44. The first resin 42 includes an inorganic filler and an epoxy resin which serve as a filler. In addition, the first resin 42 may cover the semiconductor chip 40 and the wiring member such that they are not exposed. Here, the first resin 42 may cover at least a part serving as the wiring member, that is, either the lead frame 50 or the wire 27. In one example, the first resin 42 includes an epoxy resin, a curing agent, and an inorganic filler as its main components. The first resin 42 may additionally include an additive such as a curing accelerator, a mold release agent, a colorant, or a flame retardant.

The first resin 42 includes 50 wt % or more of the inorganic filler. As one example, the first resin 42 includes 50 wt % or more and 90 wt % or less of the inorganic filler. The inorganic filler has a high glass transition temperature Tg. Note that, the glass transition temperature Tg is a temperature at which glass transition occurs. Thus, the glass transition temperature Tg of the entire first resin 42 can be increased by including a predetermined amount or more of the inorganic filler in the first resin 42, thereby improving the thermally-resistant property. That is, the semiconductor chip 40 and its surrounding are sealed with the first resin 42 having a high glass transition temperature Tg, which enables the insulating property and the strength property of the semiconductor module 100 to be maintained. The inorganic filler may be a silica filler including $SiO_2$, for example.

On the other hand, in a case where the first resin 42 includes a predetermined amount or more of the inorganic filler, the possibility of a crack being generated due to brittleness behavior is relatively increased. When a brittle fracture occurs, it occurs involving little plastic deformation. When a crack occurs in the first resin 42 and the crack propagates to the upper end of the sealing resin 12, the semiconductor chip 40 is exposed to air and the protection of the semiconductor chip 40 is weakened. As a result, it may become a cause for faulty breakdown voltage or reduction in reliability.

Accordingly, the second resin 44 is provided on the surface of the first resin 42. The second resin 44 is provided on the surface of the first resin 42 on an opposite side of the cooler 16. The glass transition temperature Tg of the second resin 44 may be relatively lower than the glass transition temperature Tg of the first resin 42. Note that, the first resin 42 and the second resin 44 may be provided to form a layer structure.

The second resin 44 may have a smaller elastic modulus than the first resin 42. The elastic modulus is a ratio between stress and strain within an elastic range when an elastic body is deformed by applying external force. The elastic modulus represents the difficulty of deforming Young's modulus may be used as the elastic modulus. By filling the space 94 with the first resin 42 and the second resin 44 which is relatively softer than the first resin 42, the stress that is generated during operation at a high temperature or the like is relaxed, as compared to a case where the space 94 is filled only with the first resin 42. This is because the stress that is generated between the resins and the side wall 18 or the like is relaxed by the use of the second resin 44 which is relatively softer than the first resin 42. In addition, even if a crack is generated in the first resin 42, a linear crack propagation can be suppressed with the use of the second resin 44 having different mechanical properties. That is, the crack can be suppressed from penetrating through the second resin 44 to reach the surface of the semiconductor module 100. Thus, the reliability of the semiconductor module 100 can be improved.

The second resin 44 may have a smaller yield stress than the first resin 42. In this way, plastic deformation occurs to the second resin 44 before the first resin 42. Accordingly, the second resin 44 is likely to rupture (break) first. In this way, the first resin 42 can be suppressed from reaching the yield stress and plastically deforming. Accordingly, the reliability of the semiconductor module 100 can be improved.

In the present example, the first resin 42 covers the semiconductor chip 40 and the lead frame 50, and the second resin 44 is separated from the semiconductor chip 40, the lead frame 50 and the circuit board 20. That is, in the present example, the second resin 44 is not in contact with the semiconductor chip 40, the lead frame 50, and any of the upper surface, the lower surface, or the side surfaces of the circuit board 20. The second resin 44 of the present example is not in contact with any of the upper surface, the lower surface, and the side surfaces of the insulating substrate 21. The second resin 44 of the present example is not in contact with any of the upper surface, the lower surface, and the side surfaces of the heat releasing board 22. The second resin 44 of the present example is not in contact with any of the surfaces of the circuit pattern 26. The side surfaces of the insulating substrate 21 may be in contact with air, and may be in contact with a member different from the second resin 44. In this way, energizing members such as the semiconductor chip 40, the lead frame 50, and the circuit board 20 can be protected with the first resin 42 having a thermally-resistant property. In addition, since the second resin 44 will not become in contact with the energizing members, it does not require a thermally-resistant property relatively. In the present example, the first resin 42 functions to protect the energizing member as the essential semiconductor package, so to speak, and the second resin 44 functions to protect the first resin 42.

Thus, the first resin 42 may have a larger total volume than the second resin 44. The first resin 42 may have a larger total weight than the second resin 44. In addition, seen in cross-section or seen from the side, the first resin 42 may be thicker than the second resin 44. As an example, the thickness T1 of the first resin 42 in FIG. 1 is 1 cm or more. As an example, the thickness T2 of the second resin 44 in FIG. 1 is 1 mm or more and 1 cm or less. Protection of the first resin 42 by the second resin 44 is used because the volume or the thickness of the second resin 44 is not required, relatively. In this way, optimization of the ratio of the first resin 42 and the second resin 44 and cost reduction can be contemplated.

In the present example, the second resin 44 includes an epoxy resin, and the sealing resin 12 is configured as a two-layer structure including epoxy resins with different physical properties. Here, the second resin 44 may have a smaller content ratio (wt %) of the inorganic filler than the first resin 42. As an example, the second resin 44 may include 50 wt % or less of the inorganic filler. The second resin 44 may or may not include the inorganic filler. In this way, the glass transition temperature Tg of the second resin 44 becomes relatively lower than the glass transition temperature Tg of the first resin 42. Note that, similarly to the first resin 42, the second resin 44 may also include an epoxy resin, a curing agent, and an inorganic filler as its main component. The second resin 44 may additionally include an additive such as a curing accelerator, a mold release agent, a colorant, or a flame retardant.

The second resin 44 may be configured to include silicone gel or silicone rubber instead of, or in addition to the epoxy resin. In this case, the second resin 44 does not have to have a smaller yield stress than the first resin 42. Note that, the silicone gel or the silicone rubber may also include other additives.

Figure 2:
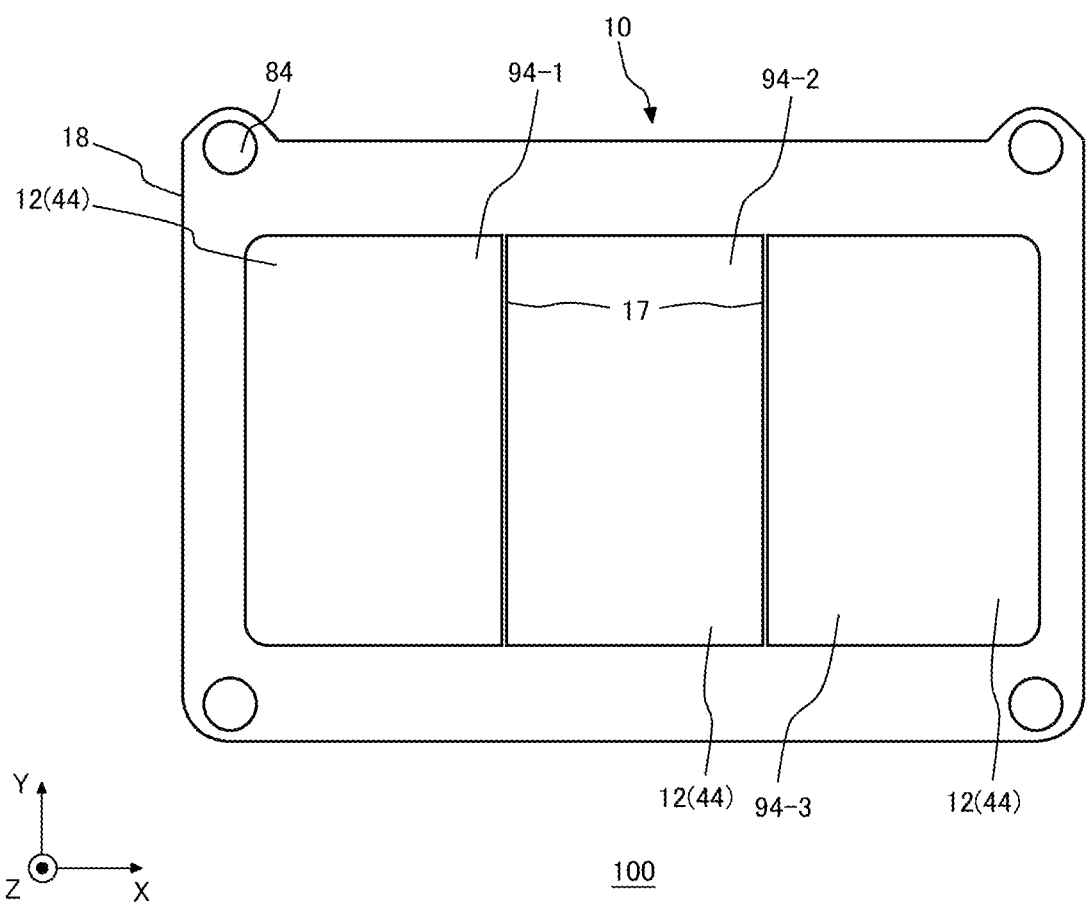
FIG. 2 illustrates an example of the semiconductor module 100 as seen from above.

FIG. 2 illustrates an example of the semiconductor module 100 as seen from above. The resin casing 10 has an inner side wall 17. The inner side wall 17 is an example of the side wall 18. The inner side wall 17 divides the space 94 housing the semiconductor chip 40. In FIG. 2, the inner side wall 17 divides the space 94 into space 94-1, space 94-2, and space 94-3. The circuit board 20 may be provided in common for the space 94-1, the space 94-2, and the space 94-3. The circuit board 20 may be provided in each of the space 94-1, the space 94-2, and the space 94-3. In addition, a through-hole 84 to which a fastening member such as a screw for fixing a cooling device or the like is inserted may be provided in the resin casing 10.

The space 94 of the resin casing 10 may be filled with the sealing resin 12 such that the wire 27, the semiconductor chip 40, and the lead frame 50 are not exposed. In FIG. 2, as seen from above, the second resin 44 of the sealing resin 12 is exposed. Note that, an external terminal that is not shown may be exposed from the sealing resin 12.

Figure 3:
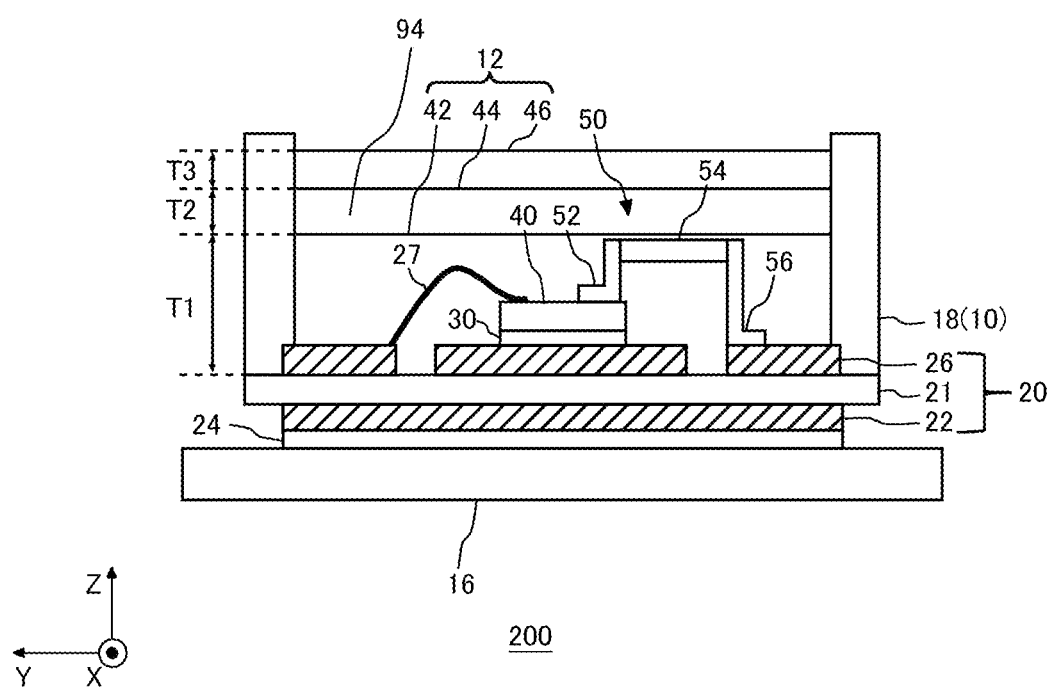
FIG. 3 illustrates an example of a semiconductor module 200 according to one embodiment of the present invention.

FIG. 3 illustrates an example of a semiconductor module 200 according to one embodiment of the present invention. The semiconductor module 200 of FIG. 3 is different from the semiconductor module 100 of FIG. 1 in that the sealing resin 12 has a third resin 46. The other configurations of FIG. 3 may be the same as that of FIG. 1. The third resin 46 is provided on at least a part of the surface of the second resin 44. In the example of FIG. 2, the third resin 46 cover the entire upper surface of the second resin 44. That is, in FIG. 3, the sealing resin 12 is configured as a three-layer structure of epoxy resins with adjacent layers having different physical properties. The third resin 46 includes, as an example, an epoxy resin, a curing agent, and an inorganic filler as its main component. The third resin 46 may additionally include an additive such as a curing accelerator, a mold release agent, a colorant, or a flame retardant.

The third resin 46 may have a larger content ratio (wt %) of the inorganic filler than the second resin 44. As an example, the third resin 46 may include 20 wt % or more of the inorganic filler. Accordingly, the glass transition temperature Tg of the third resin 46 may be higher than the glass transition temperature Tg of the second resin 44. In addition, the third resin 46 may have a smaller content ratio (wt %) of the inorganic filler than the first resin 42. In this way, the possibility of a crack being generated due to brittleness behavior can be relatively suppressed.

The third resin 46 may have a larger elastic modulus than the second resin 44. In addition, the surface of the sealing resin 12 may be covered by the third resin 46. In this way, since the third resin 46 which is relatively harder than the second resin 44 is exposed, the surface of the second resin 44 can be protected. In addition, even if a crack is generated in the first resin 42, a linear crack propagation can be suppressed since the second resin 44 and the third resin 46 having different mechanical properties lies in between. That is, the crack can be suppressed from penetrating through the second resin 44 and the third resin 46 to reach the surface of the sealing resin 12. Thus, the reliability of the semiconductor module 200 can be improved.

The third resin 46 may have a larger yield stress than the second resin 44. In this way, plastic deformation occurs to the second resin 44 before the third resin 46. As a result, the third resin 46 that is exposed from the surface of the sealing resin 12 can be suppressed from reaching the yield stress and plastically deforming Thus, entrance of air through the third resin 46 on the surface of the sealing resin 12 can be avoided. Accordingly, the reliability of the semiconductor module 200 can be improved. Note that, the third resin 46 may have a smaller yield stress than the first resin 42.

The second resin 44 may have a large total volume than the third resin 46. The second resin 44 may have a larger total weight than the third resin 46. In addition, the second resin 44 may be thicker than the third resin 46. As an example, the thickness T2 of the second resin 44 in FIG. 3 is 1 mm or more and 1 cm or less. As an example, the thickness T3 of the third resin 46 in FIG. 3 is 1 mm or more. When the thickness T3 of the third resin 46 is large, there is a possibility that the second resin 44 may be deformed due to the weight of the third resin 46. The deformation of the second resin 44 can be suppressed by making the second resin 44 thicker than the third resin 46. The third resin 46 of the present example is separated from the semiconductor chip 40, the lead frame 50, and the circuit board 20. That is, the third resin 46 of the present example is not in contact with the semiconductor chip 40, the lead frame 50, and any of the upper surface, the lower surface, or the side surfaces of the circuit board 20. The third resin 46 of the present example is not in contact with any of the upper surface, the lower surface, and the side surfaces of the insulating substrate 21. The third resin 46 of the present example is not in contact with any of the upper surface, the lower surface, and the side surfaces of the heat releasing board 22. The third resin 46 of the present example is not in contact with any of the surfaces of the circuit pattern 26.

Figure 4:
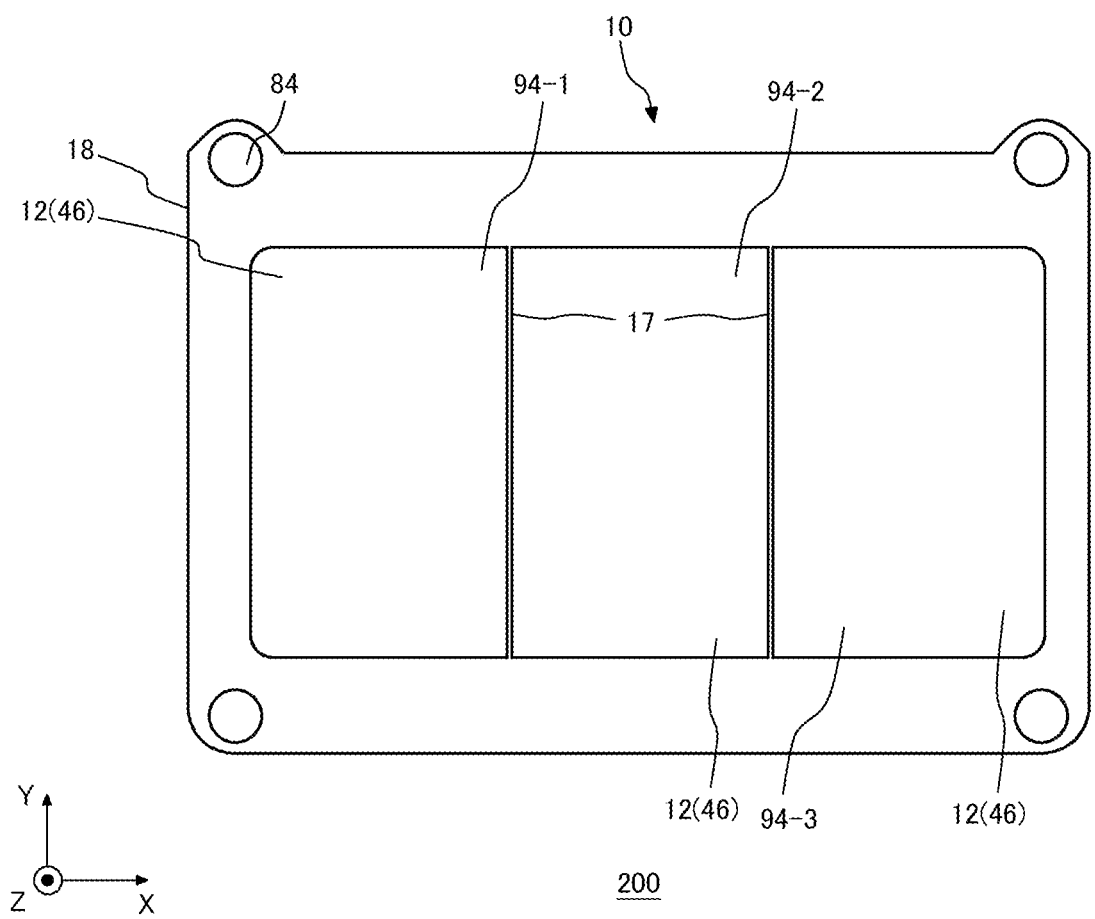
FIG. 4 illustrates an example of the semiconductor module 200 as seen from above.

FIG. 4 illustrates an example of the semiconductor module 200 as seen from above. In FIG. 4, the resin casing 10 and the sealing resin 12 are illustrated in the same manner as in FIG. 2. In FIG. 2, the third resin 46 of the sealing resin 12 is exposed as seen from above. Note that, an external terminal that is not shown may be exposed from the sealing resin 12.

Figure 5:
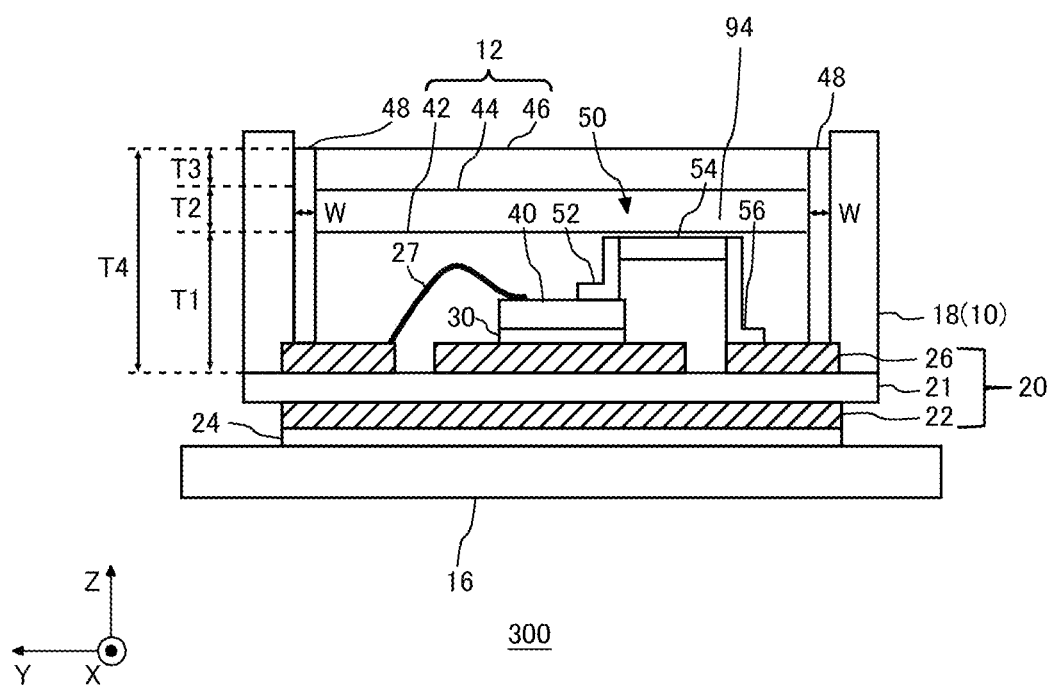
FIG. 5 illustrates an example of a semiconductor module 300 according to one embodiment of the present invention.

FIG. 5 illustrates an example of a semiconductor module 300 according to one embodiment of the present invention. The semiconductor module 300 of FIG. 5 is different from the semiconductor module 200 of FIG. 3 in that it has a buffer layer 48 between the side wall 18 and the sealing resin 12. The other configurations of FIG. 5 may be the same as that of FIG. 3.

The buffer layer 48 may surround the first resin 42, the second resin 44, and the third resin 46, as seen from above. The buffer layer 48 may be provided to cover a surface of the side wall 18 opposite to the space 94. That is, the buffer layer 48 is provided so that the first resin 42, the second resin 44, and the third resin 46 do not come in contact with the side wall 18.

The elastic modulus of the buffer layer 48 may be smaller than the elastic modulus of the second resin 44. That is, the elastic modulus of the buffer layer 48 may be smaller than the elastic modulus of any of the first resin 42, the second resin 44, and the third resin 46. By providing a buffer layer 48 having a smaller elastic modulus than that of the second resin 44, when the entire semiconductor module 300 is deforms, the buffer layer 48 follows the deformation. Accordingly, the sealing resin 12 can be prevented from coming off from the side wall 18.

In a case where the first resin 42, the second resin 44, and the third resin 46 include an epoxy resin as their main component, the buffer layer 48 includes a silicone gel as its main component, as an example. A main component is a component having a largest content ratio (wt %) in the resin. Since the buffer layer 48 includes the silicone gel, the elastic modulus of the buffer layer 48 can be smaller than the elastic modulus of the second resin 44.

In the Z axis direction, the thickness T4 of the buffer layer 48 may be the same as the total thickness of the first resin 42, the second resin 44, and the third resin 46 (T1+T2+T3). In addition, the buffer layer 48 preferably is not in contact with the wire 27, the semiconductor chip 40, and the lead frame 50. The width W of the buffer layer 48 may be 5 mm or less. The width W of the buffer layer 48 may be 3 mm or less. The width W of the buffer layer 48 may be 1 mm or less. By reducing the width W of the buffer layer 48, the buffer layer 48 can be configured such that it does not cover the wire 27, the semiconductor chip 40, and the lead frame 50.

Figure 6:
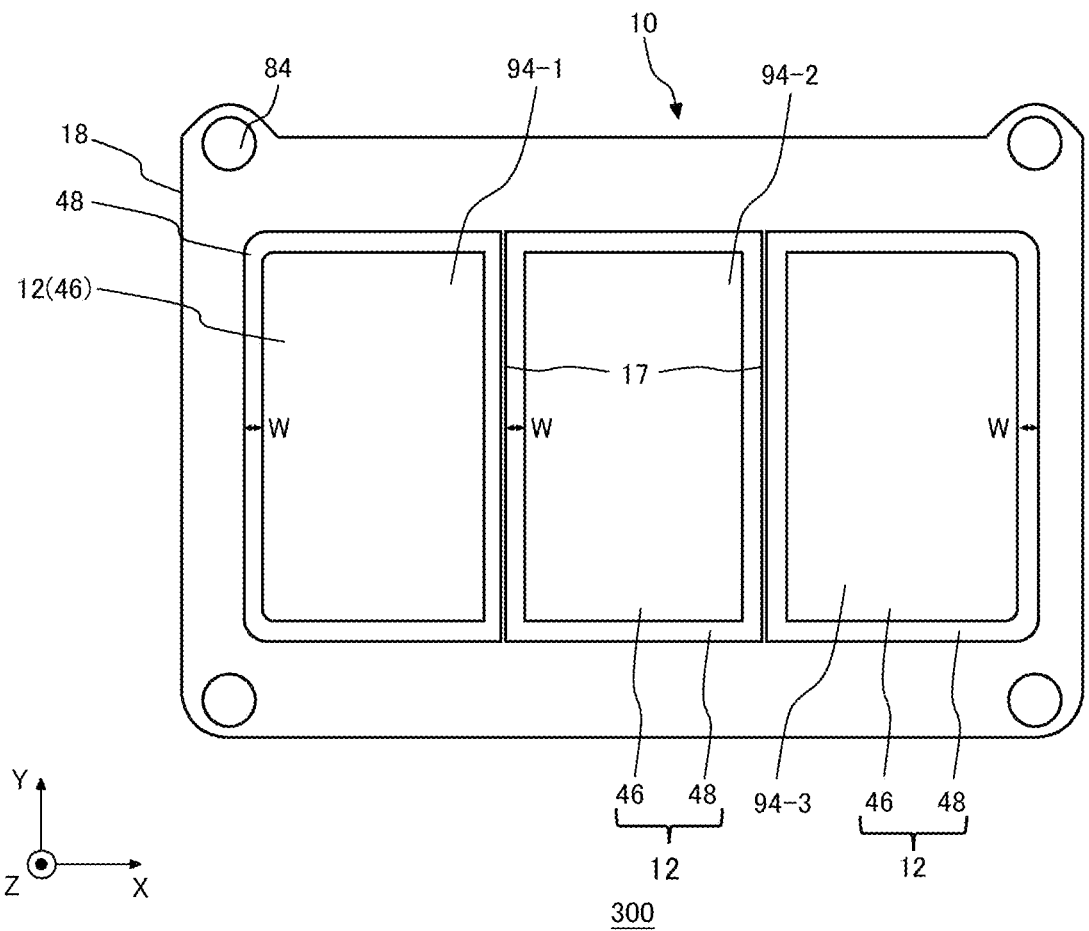
FIG. 6 illustrates an example of the semiconductor module 300 as seen from above.

FIG. 6 illustrates an example of the semiconductor module 300 as seen from above. In FIG. 6, the resin casing 10 and the sealing resin 12 are illustrated in the same manner as in FIG. 2. In FIG. 6, as seen from above, the third resin 46 and the buffer layer 48 of the sealing resin 12 are exposed. Note that, an external terminal that is not shown may be exposed from the sealing resin 12.

As shown in FIG. 6, the buffer layer 48 surrounds the third resin 6, as seen from above. The buffer layer 48 has a width W as seen from above and surrounds the third resin 46. In addition, the buffer layer 48 is provided opposite to the side wall 18 including the inner side wall 17.

Figure 7:
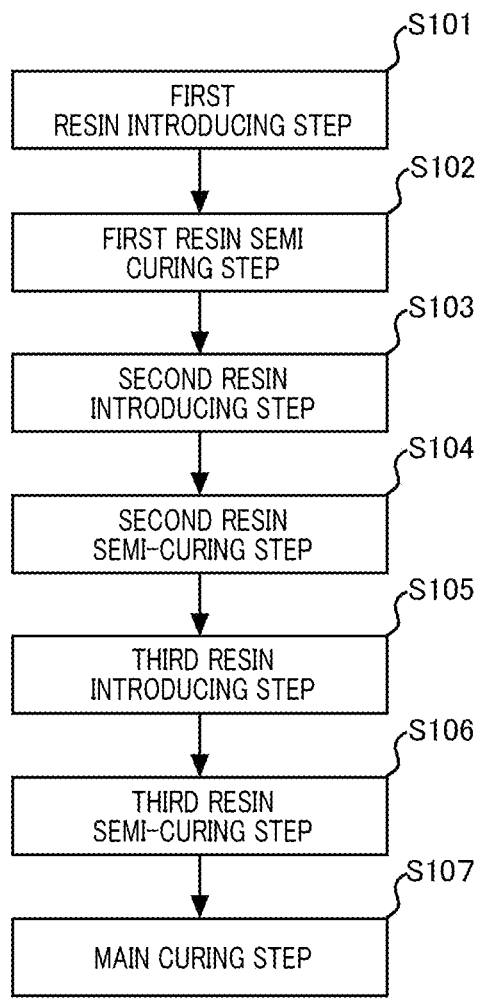
FIG. 7 illustrates an example of a method of forming a sealing resin 12.

FIG. 7 illustrates an example of a method of forming a sealing resin 12. The method of forming the sealing resin 12 includes a first resin introducing step S101, a first resin semi-curing step S102, a second resin introducing step S103, a second resin semi-curing step S104, a third resin introducing step S105, a third resin semi-curing step S106, and a main curing step S107.

At the first resin introducing step S101, the first resin 42 is introduced into the resin casing 10. At the first resin introducing step S101, the first resin 42 is introduced such that the wire 27, the semiconductor chip 40, and the lead frame 50 are covered.

At the first resin semi-curing step S102, the first resin 42 is semi-cured. At the first resin semi-curing step S102, the first resin 42 is not completely cured. The temperature of the first resin semi-curing step S102 is 50° C. to 65° C., as an example. At the first resin semi-curing step S102, gas is generated from the first resin 42.

At the second resin introducing step S103, the second resin 44 is introduced into the resin casing 10. At the second resin introducing step S103, the second resin 44 is introduced above the first resin 42. Since the first resin 42 is semi-cured, the second resin 44 can be provided above the first resin 42.

At the second resin semi-curing step S104, the second resin 44 is subjected to semi-curing. At the second resin semi-curing step S104, the first resin 42 and the second resin 44 are not completely cured. The temperature of the second resin semi-curing step S104 is 50° C. to 65° C., as an example. At the second resin semi-curing step S104, gas is generated from the second resin 44.

At the third resin introducing step S105, the third resin 46 is introduced into the resin casing 10. At the third resin introducing step S105, the third resin 46 is introduced above the second resin 44 to fill the space 94. Since the second resin 44 is semi-cured, the third resin 46 can be provided above the second resin 44.

At the third resin semi-curing step S106, the third resin 46 is semi-cured. At the third resin semi-curing step S106, the first resin 42, the second resin 44, and the third resin 46 are not completely cured. The temperature of the third resin semi-curing step S106 is 50° C. to 65° C., as an example. At the third resin semi-curing step S106, gas is generated from the third resin 46.

At the main curing step S107, the sealing resin 12 is subjected to main curing. Main curing refers to subjecting the sealing resin 12 to curing at a higher temperature than the semi-curing. The temperature of the main curing step S107 is 185° C., as an example. Gas is also generated from the sealing resin 12 in the main curing step S107. By performing the main curing step S107, the sealing resin 12 can be completely cured.

Note that, when forming the sealing resin 12 of the semiconductor module 100, the third resin introducing step S105 and the third resin semi-curing step S106 may not be performed. In this case, the second resin 44 is introduced to fill the space 94 at the second resin introducing step S103.

Figure 8:
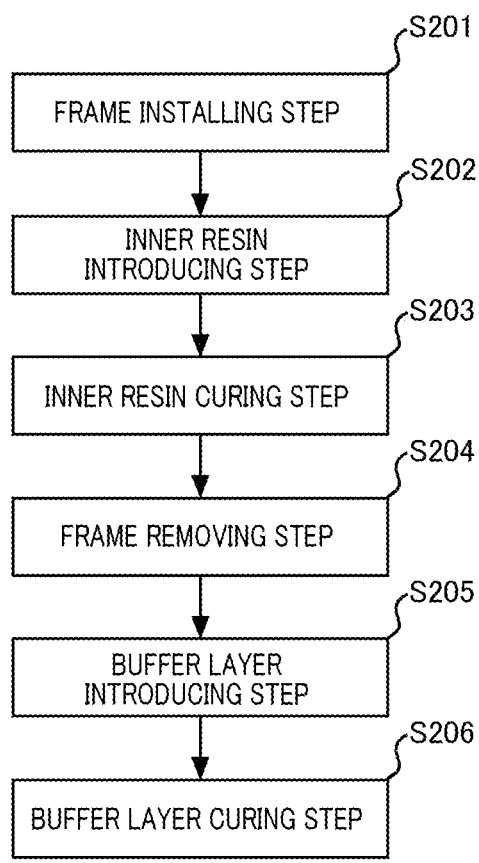
FIG. 8 illustrates an example of a method of forming the sealing resin 12 of the semiconductor module 300.

FIG. 8 illustrates an example of a method of forming the sealing resin 12 of the semiconductor module 300. The method of forming the sealing resin 12 of the semiconductor module 300 includes a frame installing step S201, an inner resin introducing step S202, an inner resin curing step S203, a frame removing step S204, a buffer layer introducing step S205, and a buffer layer curing step S206.

At the frame installing step S201, a frame 60 (see FIG. 9) is installed in the resin casing 10. The frame 60 is provided such that it surrounds the place where the first resin 42, the second resin 44, and the third resin 46 are to be introduced into. The frame 60 may be installed in contact with the side wall 18 or may not be installed in contact with the side wall 18.

At the inner resin introducing step S202 and the inner resin curing step S203, the first resin 42, the second resin 44, and the third resin 46 are introduced and cured. That is, at the inner resin introducing step S202 and the inner resin curing step S203, the first resin introducing step S101, the first resin semi-curing step S102, the second resin introducing step S103, the second resin semi-curing step S104, the third resin introducing step S105, the third resin semi-curing step S106, and the main curing step S107 in FIG. 7 may be performed. In the present example, the first resin 42, the second resin 44, and the third resin 46 are introduced inside the frame 60.

At the frame removing step S204, the frame 60 is removed. By removing the frame 60, a gap is generated between the first resin 42, the second resin 44, and the third resin 46 and the resin casing 10.

At the buffer layer introducing step S205, the buffer layer 48 is introduced. In the present example, the buffer layer 48 is introduced into the gap between the first resin 42, the second resin 44, and the third resin 46 and the resin casing 10.

At the buffer layer curing step S206, the buffer layer 48 is cured. The temperature of the buffer layer curing step S206 is 185° C., as an example.

Figure 9:
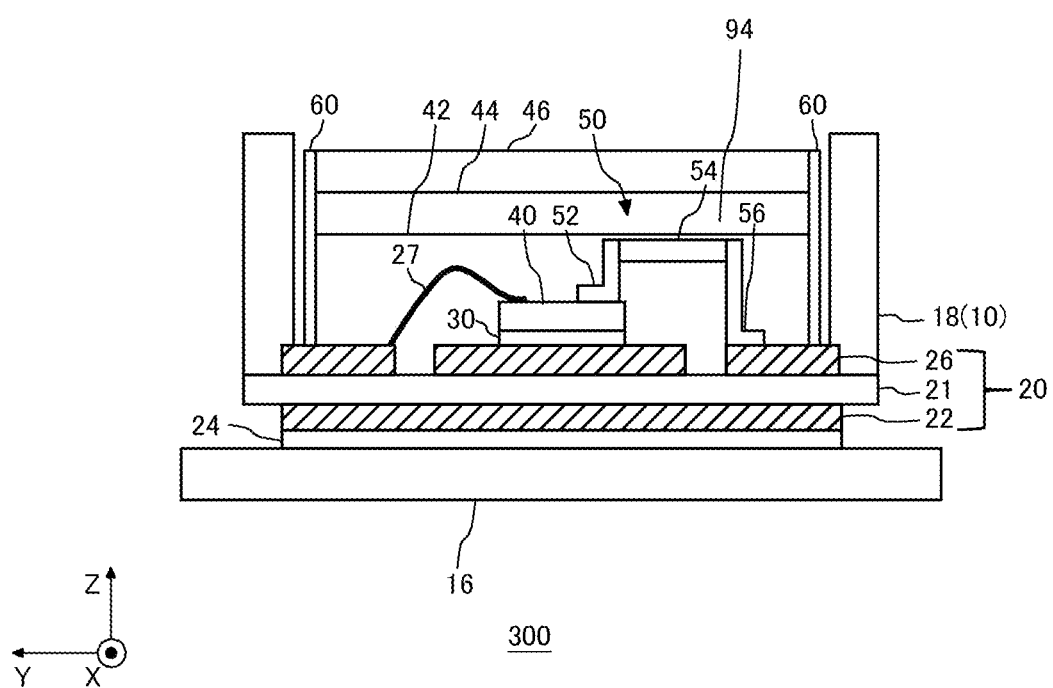
FIG. 9 illustrates an example of the semiconductor module 300 in an inner resin curing step S203.

FIG. 9 illustrates an example of the semiconductor module 300 in an inner resin curing step S203. In the present example, the frame 60 is not installed in contact with the side wall 18. As shown in FIG. 9, the first resin 42, the second resin 44, and the third resin 46 are provided inside the frame 60. After removing the frame 60 at the frame removing step S204, at the buffer layer introducing step S205, the buffer layer 48 is introduced between the first resin 42, the second resin 44, and the third resin 46, and the resin casing 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor module comprising:
a circuit board having a predetermined circuit pattern;
a semiconductor chip placed on the circuit board;
a wiring member configured to connect the semiconductor chip and the circuit pattern; and
a sealing resin configured to seal the semiconductor chip and the wiring member, wherein
the sealing resin has:
a first resin including an inorganic filler and an epoxy resin, which covers the semiconductor chip;
a second resin having a smaller elastic modulus than the first resin, which is provided on a surface of the first resin; and
a third resin having a larger elastic modulus than the second resin, which is provided on a surface of the second resin;
wherein the second resin is separated from the semiconductor chip and the circuit board;
wherein the glass transition temperature of the second resin is lower than the glass transition temperature of the first resin; and
wherein the third resin has a higher yield stress than the second resin.

2. The semiconductor module according to claim 1, wherein
the wiring member is a lead frame,
the first resin covers the lead frame, and
the second resin is separated from the lead frame.

3. The semiconductor module according to claim 1, wherein
the first resin has a larger volume than the second resin.

4. The semiconductor module according to claim 2, wherein
the first resin has a larger volume than the second resin.

5. The semiconductor module according to claim 1, wherein
the first resin includes 50 wt % or more of the inorganic filler.

6. The semiconductor module according to claim 2, wherein
the first resin includes 50 wt % or more of the inorganic filler.

7. The semiconductor module according to claim 1, wherein
the second resin has a smaller yield stress than the first resin.

8. The semiconductor module according to claim 2, wherein
the second resin has a smaller yield stress than the first resin.

9. The semiconductor module according to claim 1, wherein
the second resin includes an epoxy resin, and
the second resin has a smaller content ratio (wt %) of an inorganic filler than the first resin.

10. The semiconductor module according to claim 2, wherein
the second resin includes an epoxy resin, and
the second resin has a smaller content ratio (wt %) of an inorganic filler than the first resin.

11. The semiconductor module according to claim 1, wherein
the second resin includes a silicone gel or a silicone rubber.

12. The semiconductor module according to claim 2 wherein
the second resin includes a silicone gel or a silicone rubber.

13. The semiconductor module according to claim 1 further comprising a resin casing having a side wall and surrounding a space housing the semiconductor chip, wherein
the sealing resin is provided inside the resin casing.

14. The semiconductor module according to claim 2 further comprising a resin casing having a side wall and surrounding a space housing the semiconductor chip, wherein
the sealing resin is provided inside the resin casing.

15. The semiconductor module according to claim 13, further comprising a cooler connected directly or indirectly to the circuit board, wherein
the second resin is provided on a surface of the first resin opposite the cooler.

16. The semiconductor module according to claim 13, wherein
the first resin is thicker than the second resin.

17. The semiconductor module according to claim 13, wherein
a thickness of the second resin is 1 mm or more and 1 cm or less.

18. The semiconductor module according to claim 13, further comprising a buffer layer between the side wall and the sealing resin, wherein
the buffer layer has a smaller elastic modulus than the second resin.

19. The semiconductor module according to claim 1, wherein
the third resin includes an inorganic filler and an epoxy resin.

20. The semiconductor module according to claim 19, wherein
a thickness of the third resin is 1 mm or more, and
the second resin is thicker than the third resin.

21. The semiconductor module according to claim 1, wherein the first resin covers the semiconductor chip and the wiring member so that they are not exposed.

22. The semiconductor module according to claim 1, wherein the the first resin has a higher yield stress than the third resin.

* * * * *